United States Patent [19]

Yoshinari et al.

[11] Patent Number: 5,302,949
[45] Date of Patent: Apr. 12, 1994

[54] SIGNAL ENCODING WITH REVERSE RUN LENGTH AND VARIABLE LENGTH CODING

[75] Inventors: Hiromi Yoshinari; Yoshihiro Murakami, both of Kanagawa, Japan

[73] Assignee: Sony Corporation, Tokyo, Japan

[21] Appl. No.: 967,972

[22] Filed: Oct. 28, 1992

[30] Foreign Application Priority Data

Oct. 31, 1991 [JP] Japan .................. 3-313770

[51] Int. Cl.⁵ .................. H03M 7/40; H03M 7/46
[52] U.S. Cl. .................. 341/67; 341/63; 358/261.1
[58] Field of Search .................. 341/63, 64, 65, 67; 358/539, 261.1

[56] References Cited

U.S. PATENT DOCUMENTS

| | | | |
|---|---|---|---|
| 4,626,829 | 12/1986 | Hauck | 341/63 |
| 4,760,461 | 7/1988 | Sato | 341/63 |
| 4,811,113 | 3/1989 | Ozeki et al. | 358/261.1 |
| 5,046,122 | 9/1991 | Nakaya et al. | 358/261.1 X |
| 5,113,266 | 5/1992 | Sugiura | 358/261.1 X |

Primary Examiner—Howard L. Williams
Attorney, Agent, or Firm—William S. Frommer; Alvin Sinderbrand

[57] ABSTRACT

Luminance signal coefficient data and chroma signal coefficient data are mixed in a signal string mixing circuit and supplied to a reverse run generating circuit where a run is taken in a reverse direction with respect to the encoding direction. The run is supplied to a variable length encoding circuit for being processed with variable length encoding so that encoding is performed while the relation on the time base between the signals is maintained. This leads to an improved encoding efficiency at the time of variable length encoding.

6 Claims, 9 Drawing Sheets

| a | Y₀ | C₀ | Y₁ | C₁ | Y₂ | C₂ | Y₃ | C₃ | Y₄ | C₄ | Y₅ | C₅ | Y₆ | C₆ |
|---|----|----|----|----|----|----|----|----|----|----|----|----|----|----|
| b | 5 | 3 | 0 | 0 | 0 | 1 | 1 | 0 | 0 | 0 | 1 | 0 | 0 | 0 | c ── 0 ─────────── 5 ─────────── 10 ───────

| d | Y | C | | | | C | Y | | | | Y | | | |
| e | 2/5 | 1/3 | | | | e/1 | 1/1 | | | | e/1 | | | |
| f | CD₀ | CD₁ | | | | CD₂ | CD₃ | | | | CD₄ | | | |
| g | Y | C | | | C | Y | C | | | | Y | | Y | |
| h | 0/5 | 0/3 | | | 1/1 | 2/1 | e | | | | 1/1 | | e | |
| i | CDr₀ | CDr₁ | | | CDr₂ | CDr₃ | CDr₄ | | | | CDr₅ | | CDr₆ | |

SIGNAL ENCODING WITH REVERSE RUN LENGTH AND VARIABLE LENGTH CODING

BACKGROUND OF THE INVENTION

1. Field of the Invention

This invention relates to a method and an apparatus for variable length encoding. More particularly, it relates to a method and an apparatus for variable length encoding in which plural signals are mixed on the time base to carry out encoding by utilizing a so-called run-length coding.

2. Description of the Prior Art

In a digital video tape recorder (VTR), for example, since data to be recorded is voluminous, it is critical to decrease the data volume by compression encoding. One of a variety of high efficiency encoding techniques for data compression is variable length encoding taking advantage of a run length. The variable length encoding, which may be used singly, may also be used in combination with other encoding systems. For example, there is known a high efficiency encoding in which coefficient data produced by transform encoding is encoded by variable length encoding.

Meanwhile, if plural independent signals, such as transform coded data signals of luminance signals and chroma signals of color video signals, are mixed on the time base and processed by variable length encoding utilizing run length, the encoded results do not strictly maintain the relative position (sequence) on the time base, so that separate code tables cannot be afforded to these encoding results.

For the same reason, if a package in which the respective signal components are arrayed in the order of the increasing degree of importance is arranged into encoding blocks, the degree of importance of the components lost on error occurrence in arbitrary points of the package can not be rendered uniform.

Besides, if the contents of the package are divided into groups by signal and run distribution and separate code tables are applied for enhancing the efficiency, it is necessary to divide the groups by e.g. predetermined codes such as end-of-group codes. Therefore it becomes necessary to output the prescribed codes such as end-of-groups as separate codes even if the encoding block comes to an end in the intermediate group or to provide the predetermined codes such as end-of-groups as entirely unique codes.

SUMMARY OF THE INVENTION

In view of the foregoing, it is an object of the present invention to provide a variable length encoding method and apparatus in which the relation on the time base of the original signals may be maintained in the variable length encoded data, the position on the time base of the encoded data may be known, separate code tables may be applied to the respective signals, the encoding block may be further subdivided to enable separate code tables to be applied to improve the coding efficiency, and in which the volume of data to be recovered on error occurrence may be rendered substantially equal for the respective signals.

The present invention provided a variable length encoding method wherein, for variable length encoding of plural signals mixed on the time base, a run is taken in the reverse direction with respect to the encoding direction and variable length encoded for maintaining the relation on the time base of the encoded signals.

The present invention also provides a variable length encoding apparatus comprising signal string mixing means for mixing plural signals on the time base, means for taking runs for the mixed signals in a direction opposite to the encoding direction, and variable length encoding means for performing variable length encoding on the basis of the runs taken out in the reverse direction.

Taking a run in the reverse direction with respect to the encoding direction means combining the value of the encoding data other than a predetermined value, such as 0s, or size, and the number of data in an concatenation of the predetermined value data from the encoding data, or run length. In encoding employing the usual run length, the number of the predetermined value data, such as 0s, is counted in the encoding direction, and the value counted, or run length, and the value of the data or size are combined when data other than the predetermined value has appeared. According to the present invention, the run is taken in the opposite direction, or in the reverse direction with respect to the encoding direction. The data of the sets of the reverse run lengths and the sizes are processed with variable length encoding in accordance with predetermined code tables. For taking the reverse runs, data array may be inverted for each block (encoding block, such as a so-called sync block) as a processing unit for which encoding is carried out in succession, the above mentioned run length is found and the data array is again inverted. The produced reverse run length may be combined with the value (size) of data other than the predetermined value, such as 0s and the resulting sets may be processed with variable length encoding. It is noted that the plural signals are signals independent of each other and processed with variable length encoding based on separate code tables.

In decoding the variable length encoded data, an encoded data is-decoded to find the run length following the data and the position on the time base of the next data are known, so that separate code tables may be applied to the respective signals. The volume of data recovered on error occurrence may be rendered equal so that the encoding block may be further divided and separate code tables may be applied to the resulting sub-blocks to improve the coding efficiency.

BRIEF DESCRIPTION OF THE DRAWINGS

FIG. 5 is a schematic view for illustrating the operation of still another embodiment of the present invention.

DESCRIPTION OF THE PREFERRED EMBODIMENTS

Figure 1A:
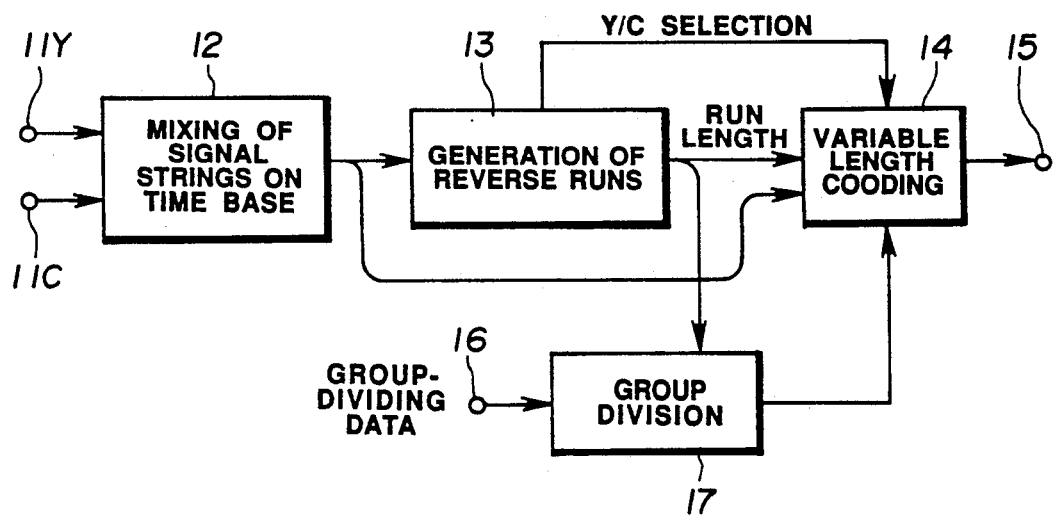
FIG. 1 is a block diagram showing a schematic arrangement of a variable length encoding apparatus according to an embodiment of the present invention.
Figure 1B:
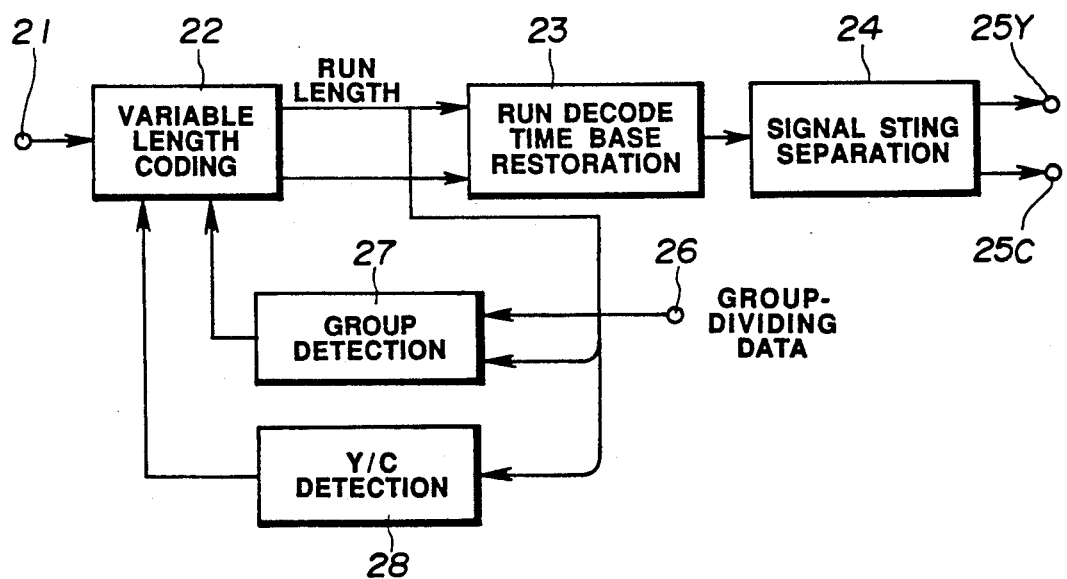

FIG. 1 shows a high efficiency encoding apparatus employed for carrying out a variable length encoding method embodying the present invention. In FIG. 1, A and B denote an encoder side and a decoder side of the apparatus, respectively.

In A of FIG. 1, independent signals, such as coefficient data of luminance signals and chroma signals, processed with, for example, discrete cosine transform (DCT), are supplied to a plurality of, for example, two, signal input terminals 11Y and 11C, respectively. These signals are supplied to a signal string mixing circuit 12 for mixing the signal strings on the time base. For example, if the signal string of luminance signals, more precisely, DCT transform coefficient data of the luminance signals $Y_0, Y_1, Y_2, \ldots$ are entered to input terminal 11Y and the signal string of chroma signals, more precisely, DCT transform coefficient data of the chroma signals, more precisely, DCT transform coefficient data of the chroma signals $C_0, C_1, C_2, \ldots$ are supplied to input terminal 11C, the signal string mixing circuit 12 mixes these signals on the time base for converting the signal strings into a signal string. $Y_0, C_0, Y_1, C_1, Y_2, C_2, \ldots$.

Output signals from mixing circuit 12, obtained by mixing on the time base, are supplied to a reverse run generating circuit 13 for taking out a run in an opposite direction to the takeout direction of usual runs, that is in a direction opposite to the encoding direction. The run means a string of data having a predetermined value, such as a concatenation of 0s. Usual or forward run takeout means taking out the number of continuous "0"s when the end of the continuous "0"s is reached, that is when data having a prescribed value "0" occur in succession and data having a value (size or level) other than "0" appear for the first time. The number of "0"s thus taken out is termed the run length. A combination data of this run length and the data value or size is processed by variable length coding. Conversely, taking out a rum in a reverse direction means taking out the number of "0"s following the above-mentioned data other than "0". The number of "0"s thus taken out is also termed a run length. A combination data of this run length and the data value or size is processed by variable length coding. That is, the forward run length and the reverse run length differ from each other with respect to the combination of the run length and the data size. More concretely, the run length ahead of the data indicating the size is used in the combination in forward run takeout whereas the run length at back of the data indicating the size is used in the combination in reverse run takeout.

Figures 2, 3:
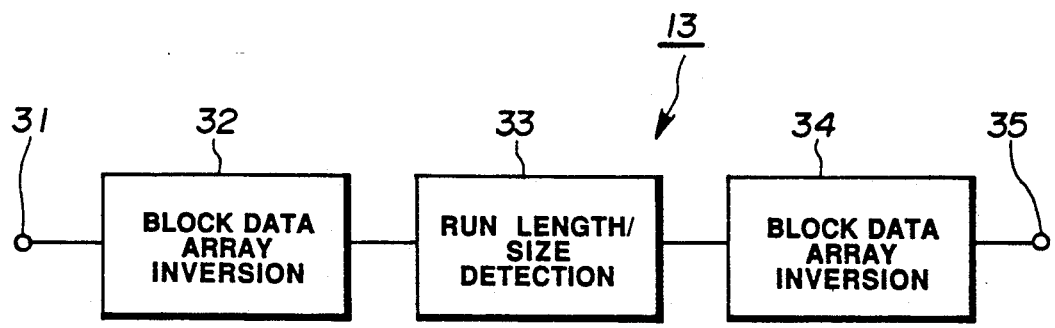
FIG. 2 is a block circuit diagram showing an example of an arrangement for taking a run in a reverse direction with respect to the encoding direction.
FIG. 3 is a schematic view for illustrating the operation of an embodiment of the present invention.

The reverse run takeout may be realized by an arrangement shown for example in FIG. 2. In this figure, plural signals mixed by the signal string mixing circuit 12 on the time base, such as the aforementioned signals. $Y_0, C_0, Y_1, C_1, Y_2, C_2, \ldots$ are supplied to input terminal 31 and thence to a block data array inverting circuit 32 where the signals are reversed front-to-back so that the data array direction on the time base is reversed. The block means a lump of data which may be processed continuously by variable length coding, or an encoding block, and corresponds to e.g. s sync block which will be explained subsequently. The block data array inverting circuit 32 may be realized by an arrangement in which input data are sequentially written in a memory of one block capacity and data are read out sequentially with the last written data first. As to the array-inverted signals (data string), sets of run lengths and sizes are taken out sequentially by a run length /size detection circuit 33 in the same way as in the usual run takeout as described above. That is, the number of "0"s which is to be a run is counted and, when data other than "0" appears, the data value or size is combined with the number of "0"s so far counted (run length) to take out data of the sets of the run length/size. The data arraying direction on the time base is inverted front-to-back by block data array inverting circuit 34 so that data in which the runs are taken out in the reverse order is taken out at output terminal 35.

The signals obtained from the signal array mixing circuit 12, that is signals $Y_0, C_0, Y_1, C_1, Y_2, C_2, \ldots$ have values as shown at b in FIG. 3, in which c denotes time base. Data other than "0", or encoding data, are as shown at d in FIG. 3 and, for each of the encoding data, data of the sets of the run length/size set data are taken, as shown at e in FIG. 3. As may be seen from a to e in FIG. 3, since the size of data $Y_0$ at a position 0 on the time base is "5", it is combined with the run length "2" of Y data following data $Y_0$ (Y data having the value of 0 are $Y_1$ and $Y_2$). Thus, data "2/5" indicating the run length/size is taken out as shown at e in FIG. 3. Similarly, since the size of data $C_0$ at a position of 1 on the time base is "3", it is combined with a reverse run length "1" and a run length/size data "⅓" is taken out. It is noted that the C data assuming the value 0 is only $C_1$. It is also noted that e entered in the run lengths of the run length/size data "e/1" for the data $C_2$ at position 5 on the time base or in the run length of the run length/size data "e/1" for data $Y_5$ at a position 10 on the time base indicates an end of block meaning that 0 data are present until the end of the block.

Output data from the reverse run generating circuit 13 indicating at least the run length and a Y/C selection signals indicating if the encoding data is data Y or data C are supplied to variable length encoding circuit 14. Although the sets of the run lengths and the sizes are taken out in the example of FIG. 2 by the run length/size detection circuit 33, it is also possible to take out only the run lengths. In this case, only the run length data are supplied from reverse run generating circuit 13 to variable length encoding circuit 14. Size data may be taken out from the mixing circuit 12 and supplied to variable length encoding circuit 14 so as to be combined with the run length data. The variable length encoding circuit 14 processes the run length/size set data with variable length encoding such as Haffmann encoding and the resulting variable encoded data or coded data CD are taken out at an output terminal 15. A concrete example of a code table used for variable length encoding is shown in the following Table 1 in which part of output code coded data for the run length/size set data are shown.

TABLE 1

| run length/size | variable length code (coded data CD) |
|---|---|
| 0/1 | 0 0 |
| 0/2 | 0 1 |
| 0/3 | 1 0 0 |
| 0/4 | 1 0 1 0 |
| 0/5 | 1 0 1 1 |
| 1/1 | 1 1 0 0 0 |
| 0/6 | 1 1 0 0 1 |
| 1/2 | 1 1 0 1 0 |
| 0/7 | 1 1 0 1 1 |
| 2/1 | 1 1 1 0 0 0 |
| 1/3 | 1 1 1 0 0 1 |
| 9/0 | 1 1 1 0 1 0 0 |
| 3/1 | 1 1 1 0 1 0 1 |
| 0/8 | 1 1 1 0 1 1 0 |
| 2/2 | 1 1 1 0 1 1 1 |
| 1/4 | 1 1 1 1 0 0 0 |
| 4/1 | 1 1 1 1 0 0 1 0 |
| 0/0 | 1 1 1 1 0 0 1 1 |
| 5/2 | 1 1 1 1 1 0 1 1 0 1 |
| 6/2 | 1 1 1 1 1 0 1 1 1 0 0 |
| 7/2 | 1 1 1 1 1 0 1 1 1 0 1 |
| 4/3 | 1 1 1 1 1 1 0 1 1 1 1 0 |
| 1/7 | 1 1 1 1 1 1 0 1 1 1 1 1 |
| e/1 | 1 1 1 1 1 1 1 0 0 0 0 0 0 |
| 2/5 | 1 1 1 1 1 1 1 0 0 0 0 0 1 |
| 8/2 | 1 1 1 1 1 1 1 0 0 0 0 1 0 |
| 3/4 | 1 1 1 1 1 1 1 0 0 0 0 1 1 |
| 9/2 | 1 1 1 1 1 1 1 0 0 0 1 0 0 |
| 5/3 | 1 1 1 1 1 1 1 0 0 0 1 0 1 |
| 6/3 | 1 1 1 1 1 1 1 0 0 0 1 1 0 |
| ... | ... |

Coded data $CD_0$, $CD_1$, $CD_2$, - - -, obtained by variable length coding of the run length/size data shown at e in FIG. 3, are shown at f in FIG. 3. If variable length coding is effected in accordance with the code table shown in the above Table 1, coded data $CD_0$ for run length/size data "2/5" is "111111000001", coded data $CD_1$ for run length/size data "⅓" is "111001", coded data $CD_2$ and $CD_4$ for run length/size data "e/1" is "111111000000" and coded data $CD_3$ for run length/size data "1/1" is "11000". However, in effect, Y and C data are processed with variable length encoding in accordance with separate coding tables. According to another practice, data within a block is divided into groups and code tables are changed over from one group of data to another.

For further improving the coding efficiency, the block data are divided into plural groups and code tables for variable length encoding are changed over from one group of data to another. To this end, group dividing data are supplied to input data 16 shown in FIG. 1. These group dividing data are supplied to a group dividing circuit 17 for matching with the above-mentioned run length/size data from reverse run generating circuit 13 before being supplied as a group division control signal to the variable length encoding circuit 14.

The variable length encoded data CD, outputted from output terminal 15, are processed with encoding and the resulting encoded data are recorded on e.g. a video tape recorder (VTR). Data reproduced from VTR are processed with decoding and the output decoded data are demodulated into data corresponding to variable length encoded data CD which are outputted at output terminal 15 so as to be supplied to an input terminal 21 of a decoder configuration shown at B in FIG. 1.

These input variable length encoded data are demodulated by variable length decoding circuit 22 to produce data indicating the run length/size sets. The run length/size set data are supplied to a run decode time base restoration circuit 23 whereby predetermined values, such as "0"s, are arrayed by a length corresponding to the run length in succession to the size data to produce the original signal string, that is plural signals mixed on the time base, such as data $Y_0$, $C_0$, $Y_1$, $C_1$, $Y_2$, $C_2$, ..., with maintenance of the original relative position on the time base. These signals are supplied to a signal string separating circuit 24 for being separated into the Y data string taken out at an output terminal 25Y and the C data string taken out at an output terminal 25C.

The group division data is transmitted or recorded/reproduced by utilizing auxiliary data portions of the so-called sync block so as to be detected by the reproducing side or decoder side before being supplied to an input terminal 26 shown at b in FIG. 1. A group detection circuit 27 transmits the group division control signal to variable length decoding circuit 22, based on the correspondence between output data from the variable length decoding circuit 22 and the group dividing data from input terminal 26 for changing over the code tables for variable length decoding. A Y/C detection circuit 28 is responsive to output data from variable length decoding circuit 22 to transmit to variable length decoding circuit 22 a Y/C changeover control signal indicating if the next decoding data is Y data or C data.

With the present embodiment, since the timing of apparition of the variable length encoding data on the time base is maintained, sequential decoding renders it clear before decoding to which signal belongs the next signal so that separate code tables may be applied thereto to improve the coding efficiency. On the other hand, the degree of importance of lost components may be equalized on error occurrence accompanying recording and reproduction. This is effective for signals which are independent of one another but which exhibit strong correlation in the degree of importance. Since the changeover from the current group to the next group may be determined from the currently decoded code, so that it becomes unnecessary to output the code indicating the group end. Besides, since it may bee seen to which group belongs the code, run continuity across neighboring groups may be utilized, while the block end may be indicated by outputting only one end-of-block corresponding to the group of the site of occurrence. The result is the further improved efficiency.

It is noted that g to i in FIG. 3 indicate comparative examples of the variable encoding in case the above-mentioned usual forward run is taken. The signals shown at a and b in FIG. 3 are used as signals obtained on mixing plural signals to be encoded on the time base. In FIG. 3, g indicates whether the encoding data is Y data or C data, while h indicates data of the run length/size set and i indicates an end of a block. There is also a system in which data "e" indicating the end of block is arranged at position 13 on the time base in association with last C data $C_6$ instead of at position 7 on the time base.

In the comparative example shown in g to i in FIG. 3, if the decoding of the variable length coded data $CD_r$ is taken account of, the run length following data $CD_{r0}$ and $CD_{r1}$ is not known at the time point when these data CD are decoded, so that it is not apparent to which of Y or C belong the next data $CD_{r2}$. Consequently, if the reverse run is taken, that is in the embodiment shown at d to f in FIG. 3, Y and C have separate code tables and decoding may be carried out by changing over between these code tables. However, if the forward run of the comparative example is taken, Y and C must have the same code table, while separate data $CD_{r4}$ and $CD_{r6}$ indicating an end of block are additionally required.

Figure 4:
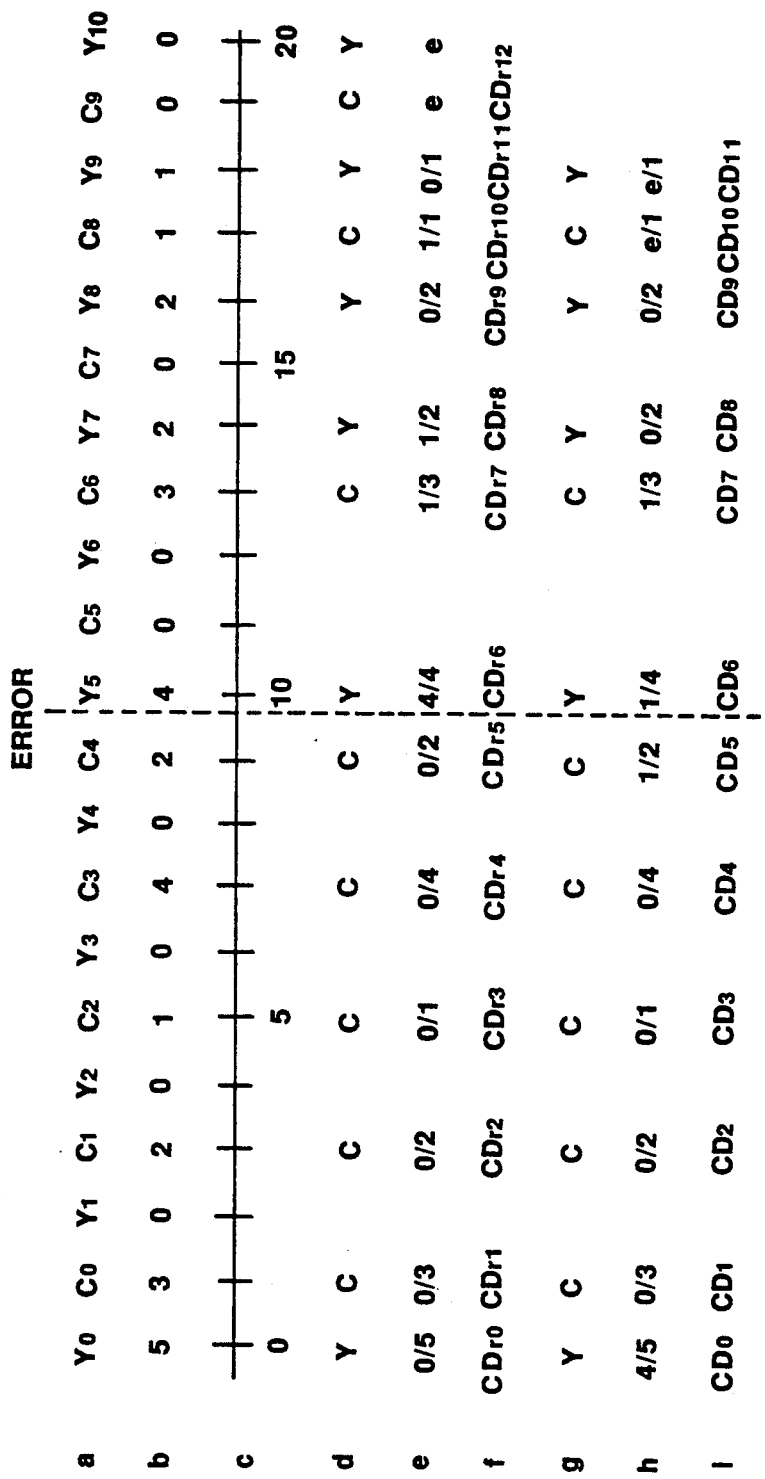
FIG. 4 is a schematic view for illustrating the operation of another embodiment of the present invention.

Error occurrences are explained by referring to FIG. 4.

In FIG. 4, showing a concrete example of variable length encoded data, comparative examples in which forward run is taken are shown at d to f and embodiments of the present invention for reverse run is taken are shown at g to i. That is, a in FIG. 4 shows data string signals obtained on mixing on the time base, such as $Y_0$, $C_0$, $Y_1$, $C_1$, $Y_2$, $C_2$, . . . , b in FIG. 4 shows concrete examples of the values of these data $Y_0$, $C_0$, $Y_1$, $C_1$, $Y_2$, $C_2$, . . . , and c denotes time base. Also, in FIG. 4, d and g indicate data other than "0"s for which a run is taken (encoding data), e and h indicate run length/size set data taken for each encoding data and f, i indicate data obtained by variable length encoding of these run length/size set data. It is noted that d to f correspond to the forward run and g to i correspond to the reverse run.

Referring to FIG. 4, when assumed that an error has occurred at position 10 on the time base and the encoding data downstream of this position, that is downstream of $CD_{r6}$ in f in FIG. 4 and downstream of $CD_6$ in i in FIG. 4, has been lost, the case in which the forward run shown at d to f in FIG. 4 is taken and the case in which the reverse run shown at g to i in FIG. 4 is taken are compared to each other.

If the forward run is taken, data decoded by the encoding data $CD_{r0}$ to $CD_{r5}$ which are not error data, are $Y_0$ and $C_0$ to $C_4$, while data $Y_1$ to $Y_4$ can not be decoded because the encoding data $CD_{r6}$ is lost. Conversely, if the reverse run is taken, the data decoded by the remaining encoding data $CD_0$ to $CD_5$ are not only $Y_0$ to $Y_4$ and $C_0$ to $C_4$, but also $C_5$ may be produced by decoding $CD_5$, so that the number of data restored on error occurrence is increased. If the data $Y_n$ and $C_n$ are of the same degree of importance, as when encoding coefficient data obtained on DCT processing in the sequence of an increasing number of orders, the reverse run is preferred because the degree of importance of data components is rendered more uniform.

Figure 5:
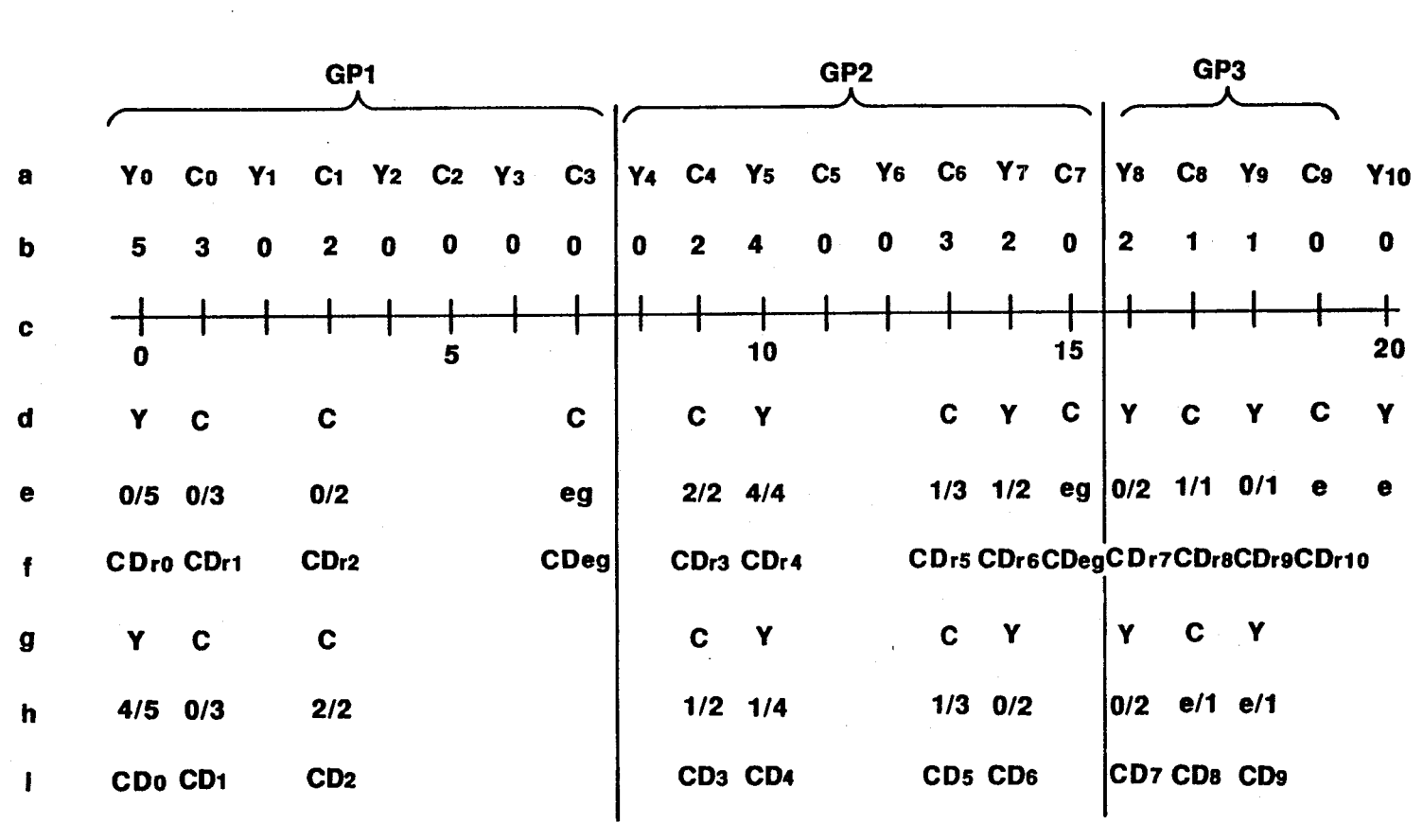

Referring to FIG. 5, the case of further dividing the data in the encoding block into groups is explained. Similarly to FIG. 4, FIG. 5 shows at d to f the case in which the forward run is taken and shows at g to i the case in which reverse run is taken. Since the contents indicated by a to i are similar to those shown at a to i in FIG. 4, the corresponding explanation is omitted for simplicity.

In FIG. 5, data at positions 0 to 7, 8 to 15 and 16 to 19 are first to third groups GP1, GP2 and GP3, respectively. When assumed that data are processed by variable length encoding by changing over the different code tables for these groups, the case in which the forward run is taken and the case in which the reverse run is taken are compared to each other.

It is seen from d to f in FIG. 5 that, when a forward run is taken, data "eg" indicating the end of group are redundantly arranged at positions 7 and 15 on the time base and outputted by conversion into corresponding encoding data $CD_{eg}$ to render it necessary to apprise the fact that the above groups have been changed. Otherwise, the relative position of the next encoded data becomes unknown so that decoding becomes impossible. It is noted that data "ebg" simultaneously indicating the end of block and end of group are arrayed at the last position 19 on the time base of the block.

Conversely, if the reverse run is taken, there is no necessity of providing encoding data indicating the end of group, as shown at g to i in FIG. 5. If only the number of data for each group is known, the next encoding data position may be known from the run length obtained on sequential decoding along the time base so that it can be seen easily to which group belongs the encoding data.

As a concrete example of an apparatus to which this embodiment may be applied, a recording apparatus for recording digital video signals, such as digital video VTR, is explained.

Figure 6:
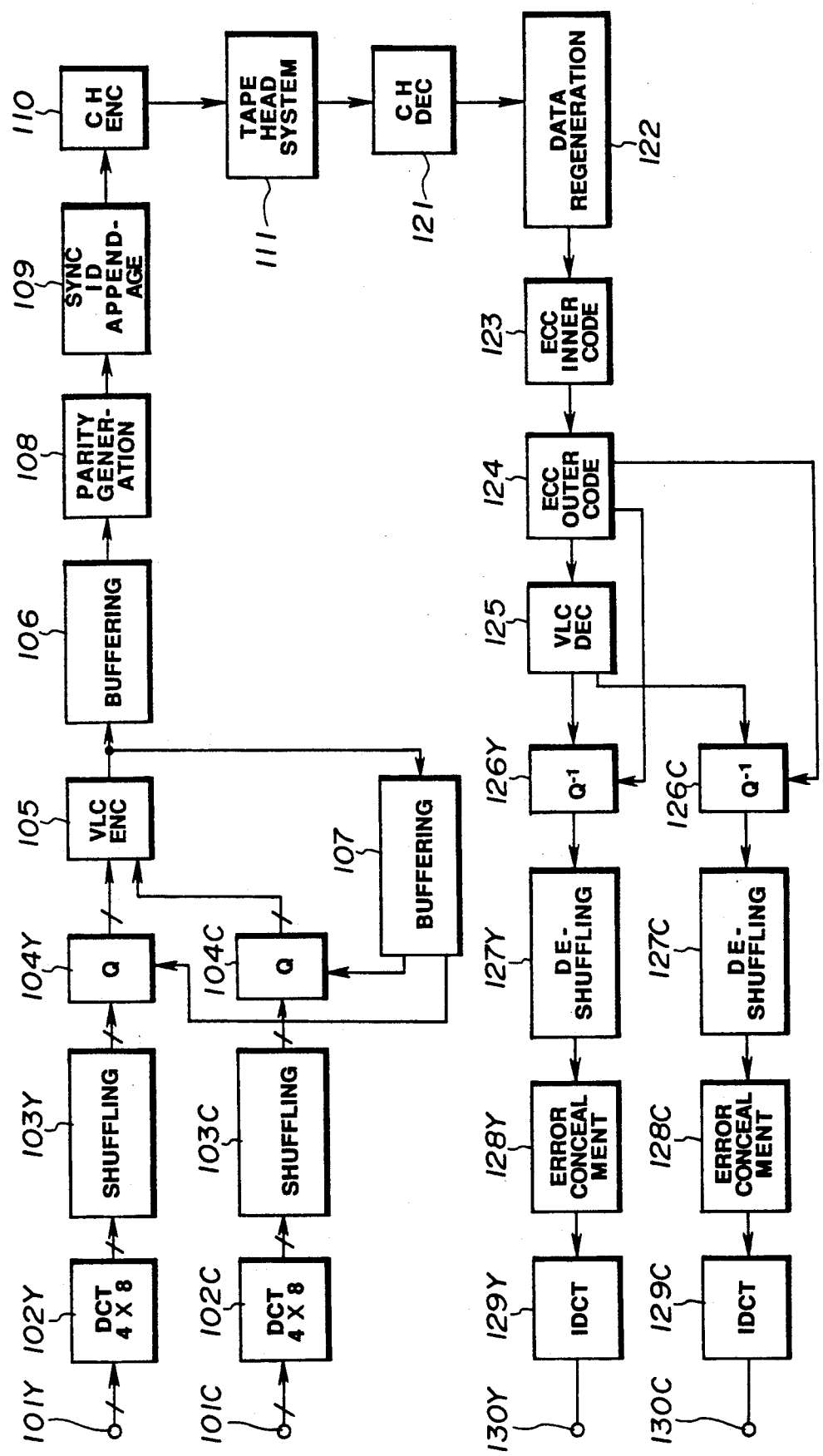
FIG. 6 is a block circuit diagram showing a recording system and a reproducing system of a digital video signal recording apparatus to which an embodiment of the present invention is applied.

FIG. 6 shows a signal processing section of a recording system and a signal reproducing system of a digital video signal recording apparatus to which the above described variable length encoding method or a variable length encoding apparatus may be applied.

In this figure, digital luminance signals y are supplied to an input terminal 101Y and digital color difference signals $C_R$, $C_B$ are supplied to input terminal 101C. In this case, the sampling frequencies of the respective signals are 13.5 Mhz and 6.75 MHz and the numbers of bits per sample are 8 to conform to the so-called 4:2:2 system (D-1 system) format. Of the input video signals, data for the blanking periods are removed and only the information of the effective region is recorded and/or reproduced. In these input signals, the data sequence is converted from the sequence of raster scanning to blocks sequence.

In the present embodiment, each field is subdivided into a large number of blocks of (8×4) pixels. That is, as indicated by the luminance signals y shown in FIG. 7, the effective information of 720 pixels×304 lines is divided into 90×76 blocks. The color difference signals $C_R$, $C_B$ are divided into 45×76 blocks.

The luminance signals y and the color difference signals $C_R$, $C_B$, divided into blocks, are processed with DCT by DCT (discrete cosine transform) circuits 102Y 102C. Coefficient data from DCT circuits 102Y and 102 C, such as Y (with 12 bits per sample) and $C_RC_B$, are supplied to shuffling circuits 103Y, 103C, respectively. The shuffling circuits 103Y and 103C are composed of field memories, for example, for modifying the array of the coefficient data Y and $C_R$, $C_B$. The shuffling circuits 103Y and 103c divide the coefficient data of each field into two portions.

That is, in the shuffling circuits 103Y, 103C, the coefficient data Y of the luminance signals is divided into Ya shown with hatching and Yb shown without hatching. These two portions are composed each of 90×38 blocks. Similarly, the coefficient data $C_R$, $C_B$ of the color difference signals are divided to form four coefficient data $C_{Rd}$, $C_{Rb}$, $C_{Ba}$ and $C_{Bb}$, each composed of 45×38 blocks.

Figure 7:
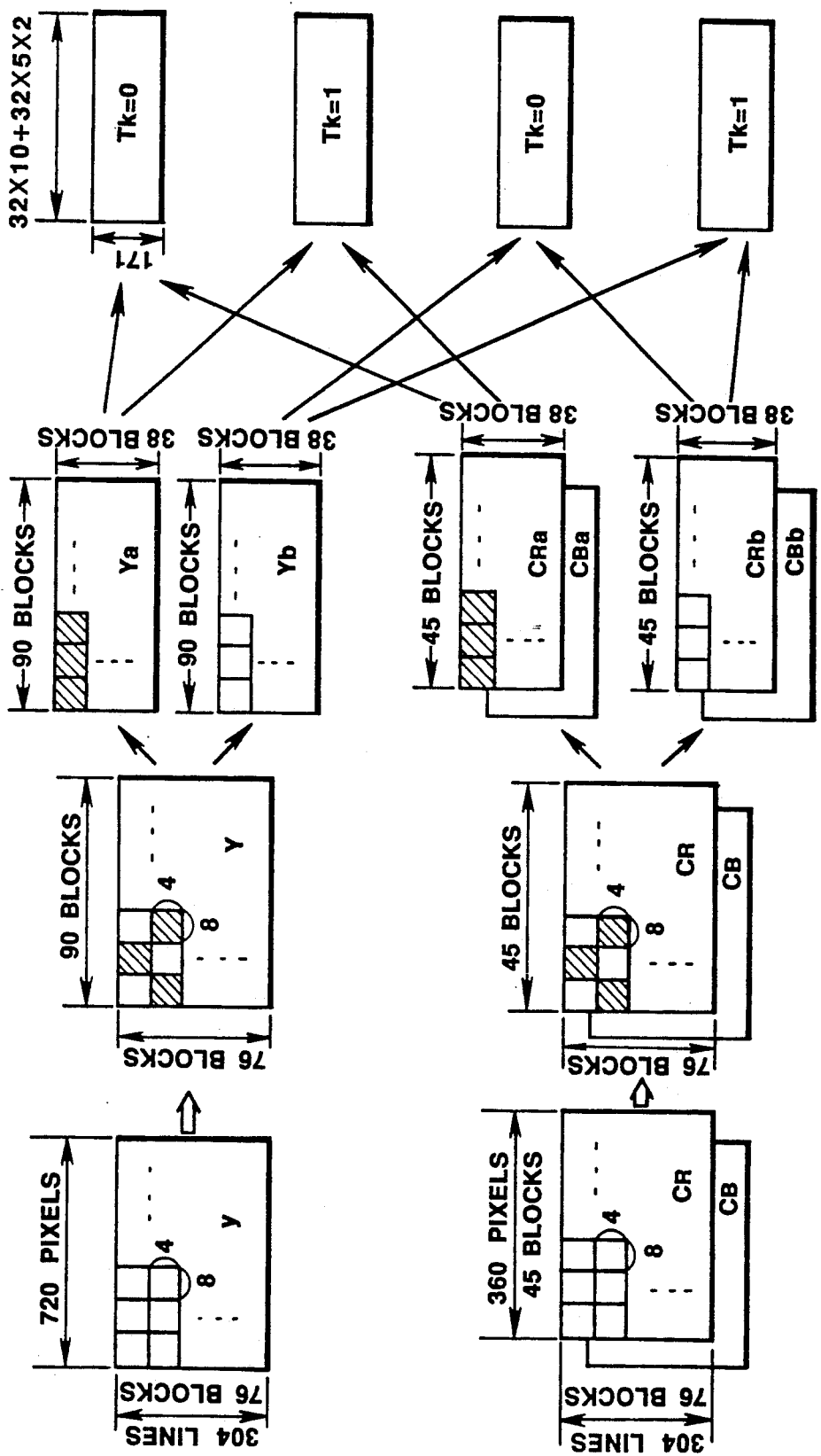
FIG. 7 is a schematic view for illustrating the processing of luminance signals of the apparatus shown in FIG. 6.

Then, as shown in FIG. 7, recording data each for ¼ field, indicated by Tk=0 and Tk=1, are formed from the coefficient data Ya and coefficient data $C_{Ra}$ and $C_{Ba}$. Similarly, recording data for ¼ field, indicated as Tk=0 and Tk=1, are formed from coefficient data Yb and coefficient data $C_{Rb}$ and $C_{Bb}$. These ¼ field recording data are recorded as four tracks. In the present embodiment, a double-azimuth magnetic head, made up of two magnetic heads arranged close to each other, are arranged at an interval of 180° so that two tracks are formed simultaneously on a magnetic recording medium, such as a video tape, and hence coefficient data concerning one-field luminance and chroma signals are recorded on four tracks.

By alternately distributing coefficient data of hatched blocks and coefficient data of non-hatched blocks on plural channels, coefficient blocks disposed on the upper and lower sides and on the left and right sides of a magnetic head subjected to clogging are reproduced by the other magnetic head to facilitate correction of the coefficient data. The coefficient data resulting from shuffling are outputted in the sequence of increasing numbers of orders of the alternating components, beginning from the coefficient data of the d.c. components. As a concrete example, coefficient data resulting from shuffling are outputted from shuffling circuits 103Y, 103C, with a sync block consisting of $32 \times 10 \times 2 = 640$ coefficient data as a unit, so as to be supplied to quantization circuits 104Y, 104C, in which 12-bit coefficient data are quantized into n-bit length data, where n is smaller than 12.

Outputs from quantization circuits 104Y, 104C are supplied to variable length encoding circuit 105 so as to be mixed on the time base to effect variable length coding with the use of a run length in the reverse direction with respect to the encoding direction. The variable length encoding circuit 105 is a circuit shown at A in FIG. 1. The present embodiment differs from the preceding embodiment of FIG. 1 in that coefficient data $C_R$, $C_B$ of color difference signals are used in place of coefficient data of chroma signals $C_R$, $C_B$ of FIG. 1 and that run lengths are taken out in the reverse direction for each of the color difference signals $C_R$, $C_B$. Coefficient data of d.c. components of the coefficient data having a higher degree of importance are not encoded by variable length encoding. Output data from variable length encoding circuit 105 are supplied to buffering circuits 106, 107. With the buffering circuits 106, 107, the length of the sync block and the volume of information per track are rendered constant, respectively.

A predetermined number of, e.g. 640, coefficient data are taken out from shuffling circuits 103Y, 103C with the sync block as a unit. Shuffling results in averaging out fluctuations in the volume of coefficient data of the blocks in each field. However, since the output from variable length encoding circuit 105 is subject to length fluctuations, the length per sync block is controlled to be constant, such as to a length of 160 bytes, by the buffering circuit 106.

Figure 8:
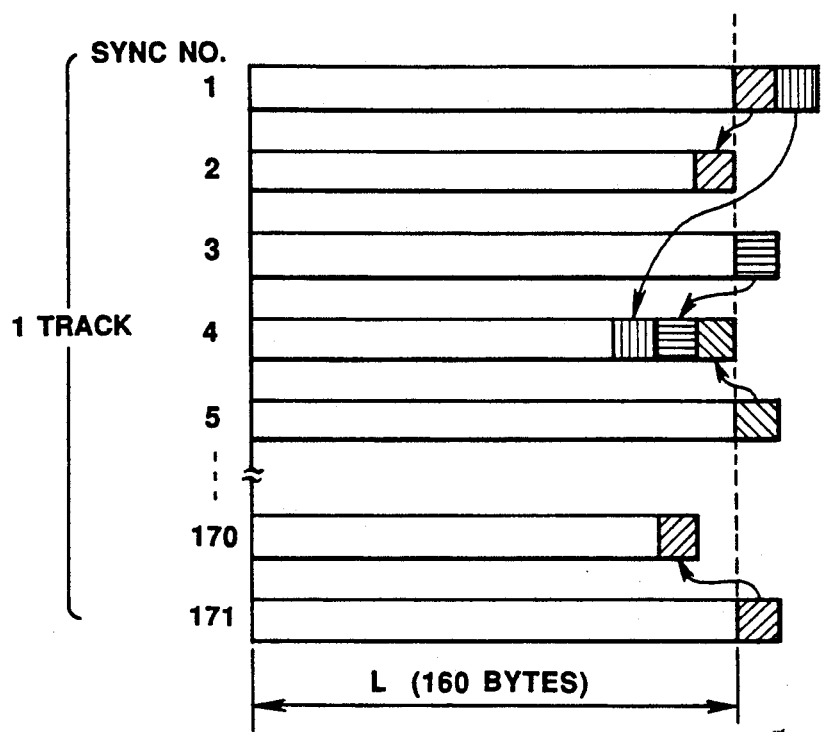
FIG. 8 is a schematic view for illustrating formation of a sync block in the apparatus shown in FIG. 6.

FIG. 8 illustrates processing of the buffering circuit 106 adapted for rendering the length of the sync block recorded on each track constant. 171 sync blocks are recorded on each track. In FIG. 8, L (160 bytes) represent an ultimate sync block length. In FIG. 8, coefficient data of d.c. components are at a leading position in each sync block and coefficient data with higher number of orders, that is less crucial coefficient data, are located at more rear positions. In the embodiment of FIG. 8, sync block number 1 data is longer than L and an access data is inserted into sync blocks of numbers 2 and 4, while excess data of sync block number 3 and 5 data are inserted into sync block number 4 data. A similar adjustment operation is carried out in the same manner until excess data of the sync block number 171 data is inserted into sync block number 170 data. A vacancy exists in the sync block number 170.

When the constant length operation is carried out in this manner, auxiliary data such as ID codes indicating the length of the variable length portion of a coefficient data block, that is coefficient data of a.c. components, are to be recorded for restoring the original one-block coefficient data on the playback side, while auxiliary data indicating to which address of the sync block the excess block data have been transferred. In this manner, the sync block length in the output of the buffering circuit 106 is rendered substantially constant.

The role of the buffering circuit 107 is to control the step width of quantization to render the volume of the information per track constant. That is, by enlarging the quantization step width, the number of bits n becomes smaller or larger with increase or decrease of the quantization step width, respectively. The buffering circuit 107 is provided with a circuit for estimating the volume of generated data of the current field from the data volume of the preceding field, and the width of the quantization step is controlled in accordance with the estimated volume of data generation. In the present embodiment, control is made so that the sum of the output lengths of the variable length encoding circuit 105 is not more than $L \times 171$ in terms of a track length.

Figure 9:
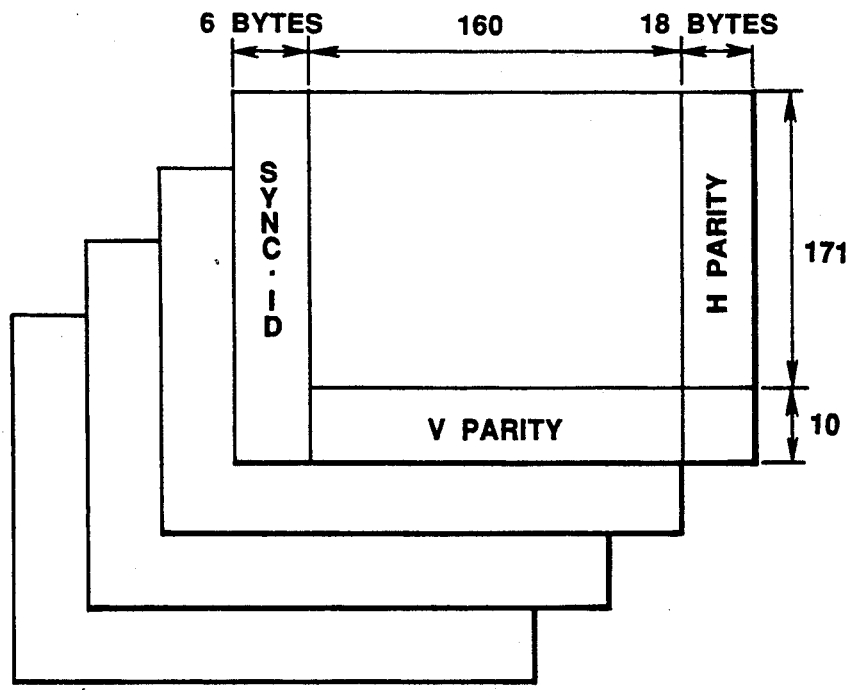
FIG. 9 is a schematic view for illustrating recording signals produced by the apparatus shown in FIG. 6.

Output data from buffering circuit 106 are supplied to a parity generating circuit 108 for error correction encoding. As an example, a product code employing a Reed Solomon code is used for each recording data of each of $160 \times 171$ tracks, as shown in FIG. 9. That is, H parity of the Reed Solomon code is formed for coefficient data of the sync blocks in the horizontal direction, while V parity of the Reed Solomon code is formed for coefficient data in the vertical direction and H parity. The coefficient data of the other tracks are processed by a similar error correction coding.

Outputs of the parity generating circuit 108 are supplied to a sync and ID appendage circuit 109 where auxiliary data such as sync signals and ID codes are appended with a sync block as a unit. Outputs of the sync and ID appendage circuit 109 are supplied to encoder 110 for channel encoding. Channel encoding decreases the d.c. components of the recording data. Output data of channel encoder 110 are supplied via a recording amplifier, not shown, to the four magnetic heads of tape header system 111 for recording two tracks on the magnetic tape.

The shuffling operation is explained by referring to FIG. 10. Although the shuffling operation for coefficient data of luminance signals is shown in FIG. 10, a similar operation is performed for color difference signals. FIG. 10A shows coefficient data consisting of $90 \times 38$ blocks corresponding to Ya or Yb shown in FIG. 7. That is, since there are $8 \times 4$ or 32 coefficient data in one block, the sum total of the coefficient data is 109,440. Since 640 coefficient data are contained in one sync block, there are 171 sync blocks in one field. A horizontal position H (=0 to 89) and a vertical position (=0 to 37) are defined for this two-dimensional array. Besides, a coefficient number C0 is defined for 32 coefficient data in one block, as shown in FIG. 10B. Coefficient data at an upper left corner (C0=8) is the above-mentioned d.c. component and the number of order becomes higher, that is the higher frequency component coefficient data are presented, in the sequence of the zigzag-shaped scanning.

Shuffling is a processing in which the track number Tk, sync number SY and the coefficient number Cn are determined by the following formula:

$Tk = [(C0 \yen 16) + H + V] + mod.2$ $SY = [9 \times V + 67 \times H + 171 \times Cn)/16] mod. 171$ $$CN = [C0 + 8 + 4 \times (C0 \not\cong 16)] mod.171$$

where ($C0 \not\cong 16$) means that 0 to 15 of C0 is set to 1 and 16 to 31 is set to 1.

Figure 10A:
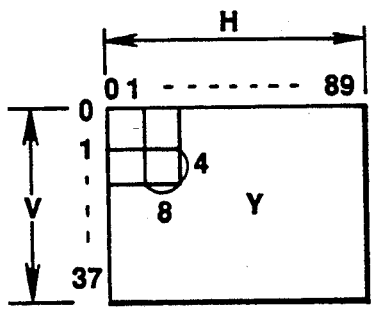
FIG. 10 is a schematic view for illustrating shuffling in the apparatus shown in FIG. 6.
Figure 10C:
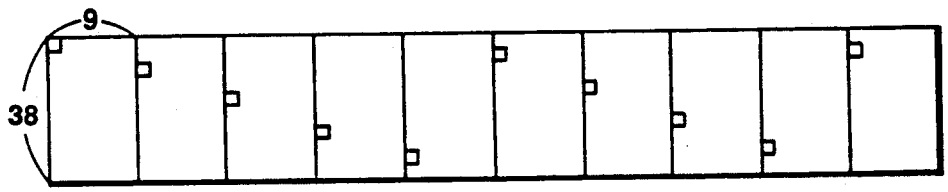
Figure 10C:
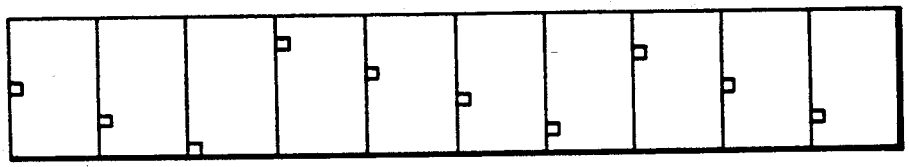
Figure 10C:
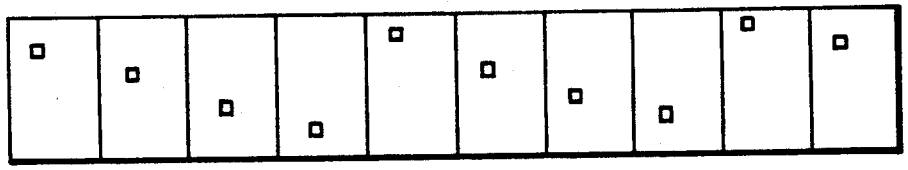

By the above formula, the track number of 0 or 1 is decided, the sync block numbers of 0 to 170 are decided and the coefficient number Cn of 0 to 15 are decided. FIG. 10C shows a concrete example of shuffling in which the cases of (Tk=1, SY=0, C0=8), (Tk=1, SY=0, C0=8) are shown sequentially from above. As shown at C at step S10, 90×38 block coefficient data are divided into ten zones, each being 9×38 zones in size, and coefficient data are contained in the same sync block from the DCT block as shown.

Figure 10D:
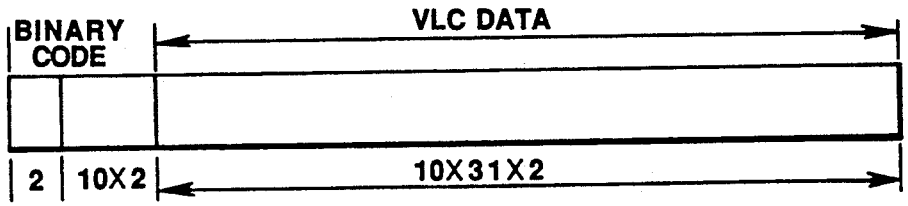

As a result of the shuffling, data are outputted in the sequence of from lower order to higher order, as shown in FIG. 10D. Two left-side data shown in FIG. 10D show the quantization levels of the luminance signals Y and the color difference signals C. The following 10×2 data are 10 d.c. component coefficient data from 10 DCT blocks for each of Y and C. The following 10×31×2 data are 10 a.c. component coefficient data from 10 DCT blocks for each of Y and C. The d.c. component data are not processed with the above-mentioned variable length encoding and a.c. component coefficient data are processed with variable length encoding using the run length in the reverse direction. The coefficient data of the a.c. component are arrayed in the increasing number of orders. As a result of this sequencing, bits of coefficient data processed with a constant sync block length are coefficient data of the higher order. The bits controlled by excess and deficit are affected by errors from other sync blocks, so that it is desirable to use coefficient data of a higher order as compared to the d.c. component data.

Reverting to FIG. 6, playback data from a tape head system 111 are supplied via channel decoding circuit 121 to a data reproducing circuit 122. Playback data from data reproducing circuit 122 are supplied to an inner code decoder 123 for being processed with error correction employing H parity in the horizontal direction. Error correction is then made in an outer code decoder 124 using the V parity in the vertical direction. Of the error-corrected playback data from decoder 124, data concerning luminance signals and data concerning color difference signals are supplied to variable length decoding circuit 125C. This decoder corresponds to the variable length decoding device shown in FIG. 1B. Outputs from decoder 125 are distributed into data concerning luminance signals and data concerning color difference signals so as to be supplied to reverse quantization circuits 126Y, 126C. Downstream of these reverse quantization circuits 126Y, 126C, separate processing is carried out for the luminance signals and color difference signals. This processing is, however, substantially analogous for the luminance and color difference signals.

By the reverse quantization circuit 126Y, the quantization level is converted into a representative value. In this case, data indicating the quantization level supplied from decoder 124 to the reverse quantization circuit 126Y are used. The representative value is supplied to deshuffling circuit 127Y where a deshuffling operation of rearraying data to its original sequence, which is the reverse of the operation carried out by the shuffling circuit 103Y of the recording system, is carried out.

Outputs from deshuffling circuit 127Y are supplied to an error concealment circuit 128Y.

The error concealment circuit 128Y conceals errors uncorrectable by decoders 123, 124 (indicated by error flag) by correct coefficient data contained in the other neighboring DCT blocks. By shuffling and deshuffling, it is possible to prevent the coefficient data in a block from being in error in their entirety to prevent deterioration of the picture quality. Simultaneously, the risk that the errors which are of the same order as the coefficient errors to be concealed and which are contained in the neighboring other coefficient blocks become errors is reduced to raise the error concealment ability. Output data from error concealment circuit 128Y are supplied to reverse conversion circuit 129Y. Luminance data restored from the coefficient data are obtained at an output terminal 130Y.

Similarly to the luminance signals, the color difference signals are supplied from variable length decoding circuit 125 to reverse quantization circuit 126C and thence to deshuffling circuit 127C, error concealment circuit 128C and reverse conversion circuit 129C and processed to produce restored color difference data at output terminal 130C. The restored data produced at output terminals 130Y, 130C are in the sequence of the blocks and the data sequence is inverted in the sequence of raster scanning by a deblocking circuit, not shown.

Figure 11A:
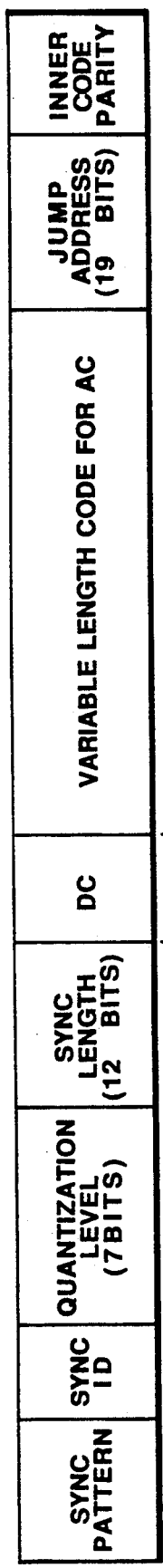
FIG. 11 is a schematic view showing a concrete example of a sync block and a run in the apparatus shown in FIG. 6.
Figure 11B:
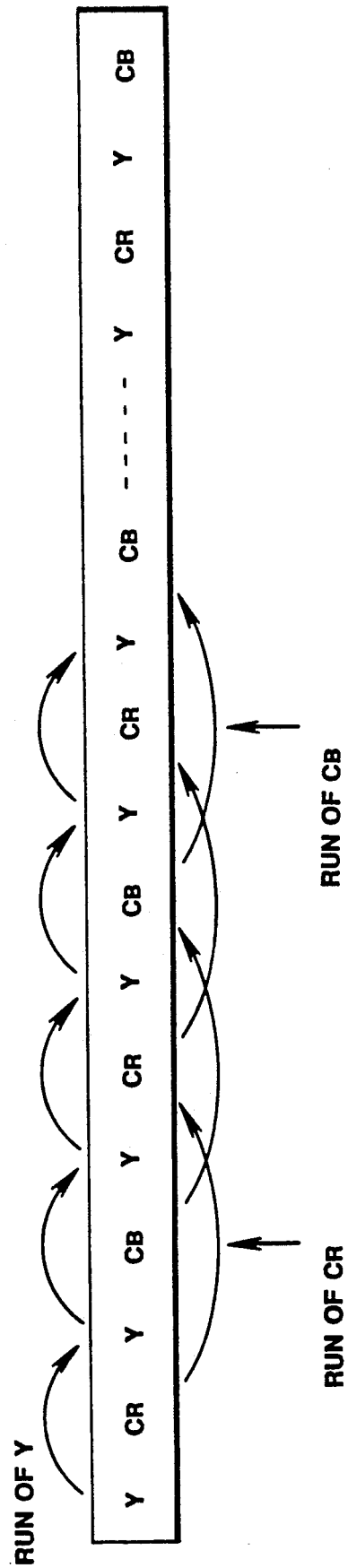

FIG. 11A shows an example of a variety of sync block formats of signals recorded on a magnetic tape. In FIG. 11A, a sync pattern, a sync ID information, 7-bit quantization level information, 12-bit sync length information, coefficient data of d.c. component having a fixed length of 20×n bits, variable length coding data of the a.c. components, 19-bit jump addresses and the inner code parity, are arrayed from a leading end of a sync block. The 19-bit jump address consists of 8-bit sync number and 11-bit information (domain) address. FIG. 11B shows a run for producing the a.c. variable length coding data and each run is taken for coefficient data Y of luminance signals and, coefficient data of color difference signals $C_R$, $C_B$. The run direction is reverse with respect to the encoding direction, as discussed above.

It is to be noted that the present invention is not limited to the above embodiments in which coefficient data obtained by DCT processing of the luminance signals and chroma or color difference signals are processed as input signals by variable length coding. For example, transform other than DCT may be employed, while encoding may be made by sub-band encoding. The arrangement of the apparatus shown in FIG. 1 may also be modified. For example, the group dividing circuit 17 may be eliminated. The reverse run generating circuit 13 may be modified from the arrangement shown in FIG. 2. The appliances may be digital tape recorder or a digital disc player without being limited to a digital VTR.

What is claimed is:

1. A method for variable length encoding comprising the steps of mixing plural signals on the time base, taking runs for the signals mixed on the time base in a direction opposite to the encoding direction, and performing variable length encoding on the basis of the runs taken out in the reverse direction.

2. The method as defined in claim 1 wherein the step of taking the run in the reverse direction comprises the substeps of inverting a data array in one of encoding blocks as variable length encoding units, taking runs in a usual direction for the data array inverted signals, and inverting the data array in the block for which the run is taken.

3. The method as defined in claim 2 wherein the step of taking the run in the usual direction comprises the substeps of combining a size as a data value of encoding data other than 0 and a run length from the encoding data which is the number of continuous 0 data along the encoding direction and sequential finding sets of the size and the run length.

4. The method as defined in claim 1 wherein said plural signals are independent signals and processed with variable length encoding on the basis of independent code tables for respective signals.

5. A variable length encoding apparatus comprising signal string mixing means for mixing plural signals on the time base, means for taking runs for the mixed signals in a direction opposite to the encoding direction, and variable length encoding means for performing variable length encoding on the basis of the runs taken out in the reverse direction.

6. The apparatus as defined in claim 5 wherein said means for taking runs comprise means for inverting a data array in one of encoding blocks as variable length encoding units, means for taking runs in a usual direction for the data array inverted signals, and means for inverting the data array in the block for which the run is taken.

* * * * *